United States Patent
Watarai

[11] Patent Number: 5,910,744
[45] Date of Patent: Jun. 8, 1999

[54] VARIABLE DELAYING CIRCUIT HAVING A NEARLY LINEAR DELAY CHARACTERISTIC

[75] Inventor: Seiichi Watarai, Tokyo, Japan

[73] Assignee: NEC Corporation, Tokyo, Japan

[21] Appl. No.: 08/924,933

[22] Filed: Sep. 8, 1997

[30] Foreign Application Priority Data

Sep. 18, 1996 [JP] Japan ................................ 8-246268

[51] Int. Cl.[6] ........................................................... H03K 5/13
[52] U.S. Cl. .......................... 327/263; 327/276; 327/277; 327/136; 327/133
[58] Field of Search ................................... 327/263, 264, 327/276, 277, 278, 281, 284, 285, 288, 131, 133, 136, 134, 344, 266, 280, 287

[56] References Cited

U.S. PATENT DOCUMENTS

| | | | |
|---|---|---|---|
| 4,438,404 | 3/1984 | Philipp | 327/263 |
| 4,449,059 | 5/1984 | Dickes | 327/132 |
| 5,760,623 | 6/1998 | Hastings | 327/137 |

*Primary Examiner*—Timothy P. Callahan
*Assistant Examiner*—Eunja Shin
*Attorney, Agent, or Firm*—Scully, Scott, Murphy & Presser

[57] ABSTRACT

A first capacitor 7, a resistor 5, and a second capacitor 6 are connected in series between an output node A and a first power supply line 22. In addition, a first switch 8 is connected between the connected point of the first capacitor 7 and the resistor 5 and a second power supply line. A second switch 9 is connected in parallel with the second capacitor 6. The first and second switches 8 and 9 are opened or closed corresponding to the level of the input signal.

13 Claims, 4 Drawing Sheets

F I G. 4
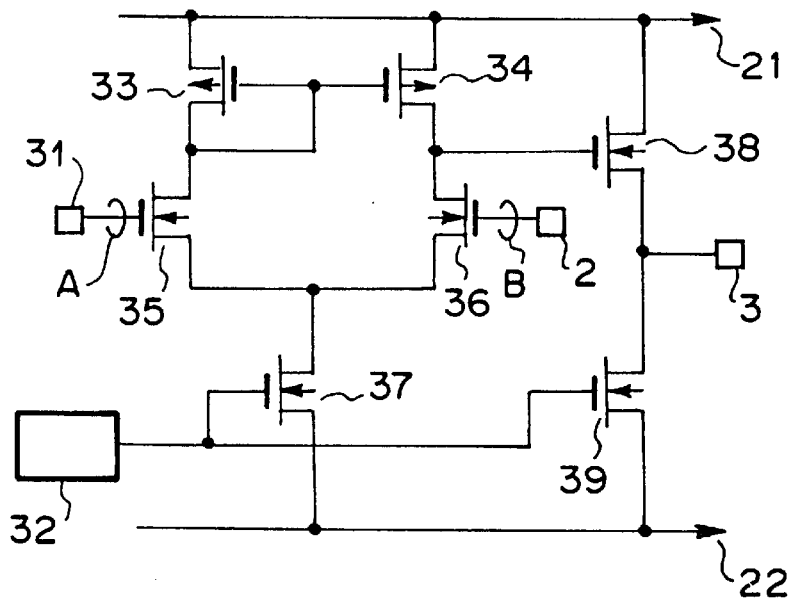
F I G. 5
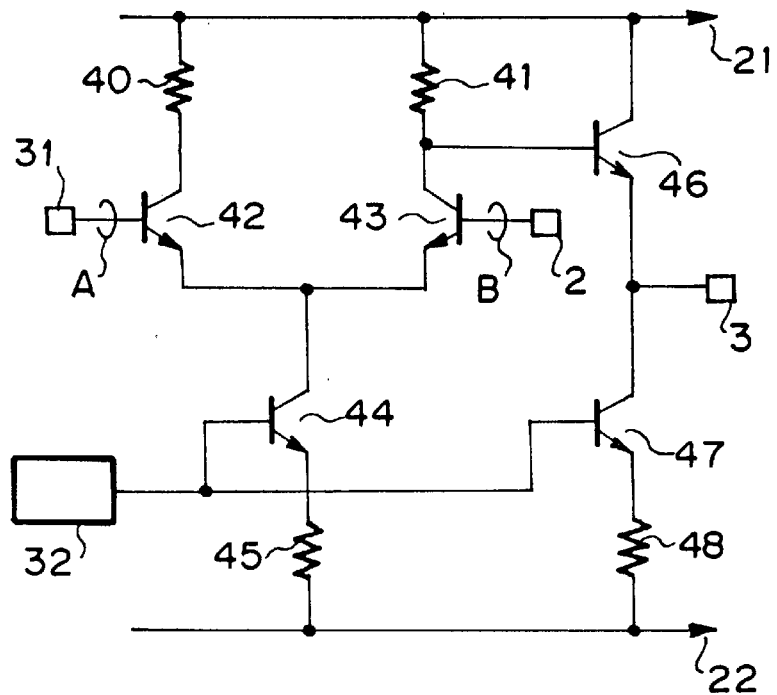

PRIOR ART FIG.6
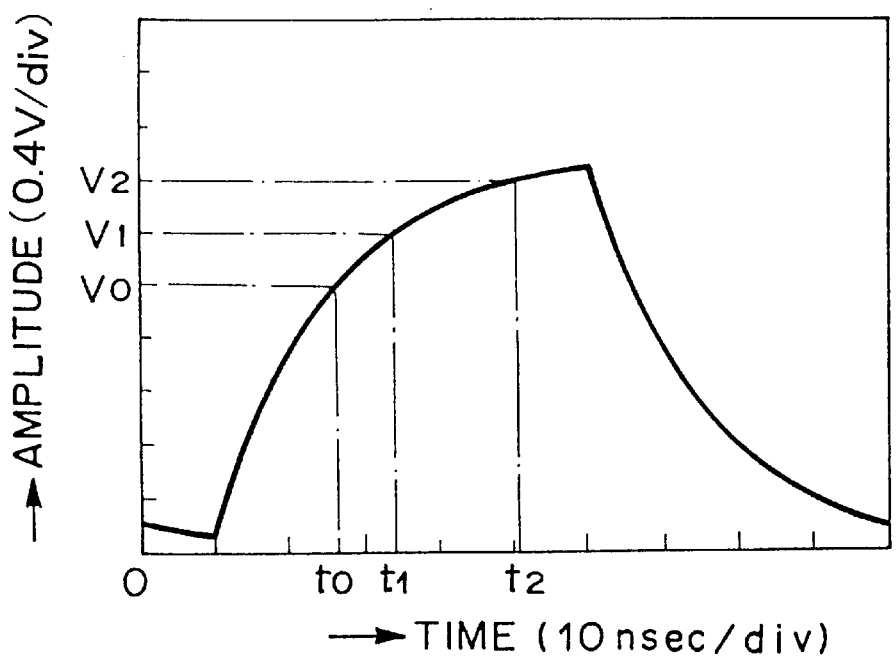
FIG.7
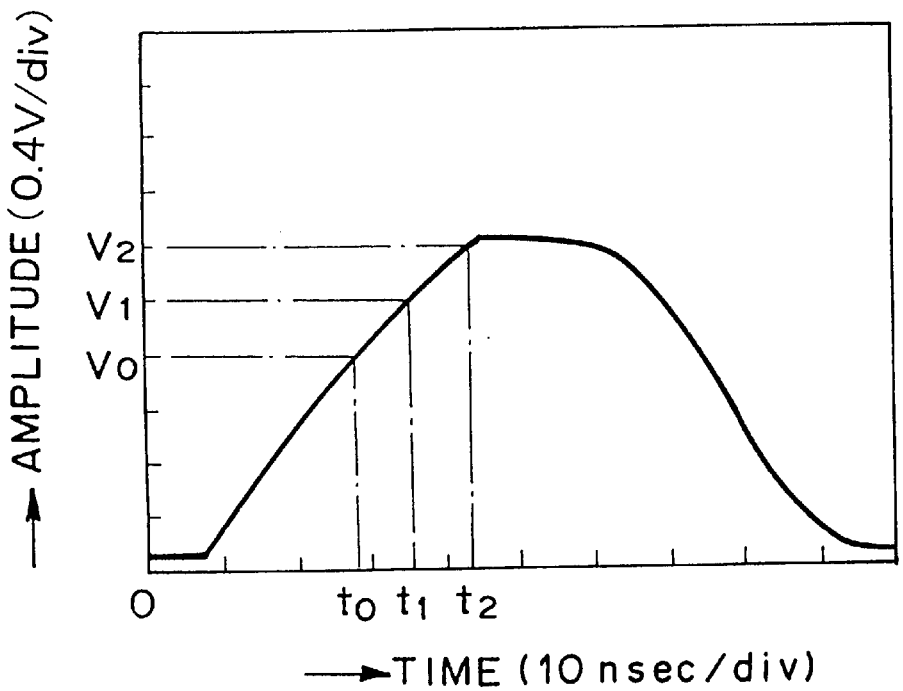

VARIABLE DELAYING CIRCUIT HAVING A NEARLY LINEAR DELAY CHARACTERISTIC

BACKGROUND OF THE INVENTION

1. Field of the Invention

The present invention relates to a variable delaying circuit for easily controlling a delay time.

2. Description of the Related Art

Generally, hardware of an electronic unit is composed of a plurality of integrated circuits. Most of control commands that designate the operations of such a unit are composed of electric control signals. Thus, to properly control the electric unit, a technology for precisely adjusting control signals is required. In addition, control signals have a time base fluctuation element (namely, jitter). When a jitter takes place in a control signal, the time base of the control signal should be compensated so as to remove the jitter therefrom.

Corresponding to such a technology, the variable delaying circuit should precisely control a delay amount (namely, so-called high resolution).

Next, related art references of conventional delaying circuits will be described.

FIG. 3 is a circuit diagram showing a related art reference of a variable delaying circuit.

In FIG. 3, a first terminal of a resistor 5 is connected to an input terminal 1. A first terminal of a capacitor 6 and a first input terminal of a comparator 4 are connected to a second terminal of the resistor 5. A second terminal of the capacitor 6 is connected to a second power supply 22. A second input terminal of the comparator 4 is connected to a reference input terminal 2. An output terminal of the comparator 4 is connected to an output terminal 3.

In this example, one input terminal connected to the second terminal of the resister 5 and the first terminal of the capacitor 6 are referred to as node A. The other terminal connected to the reference input terminal 2 is referred to as node B.

Next, with reference to FIGS. 4 and 5, most typical structures of the comparator 4 will be described.

FIG. 4 shows an example of the structure of the comparator 4 that is composed of only MOS transistors.

In FIG. 4, a gate of an NMOS transistor 35 is connected to an input terminal 31. A gate of an NMOS transistor 36 is connected to a reference input terminal 2. A gate of a PMOS transistor 33 and a gate of a PMOS transistor 34 are connected to a drain of the NMOS transistor 35. A drain of the PMOS transistor 34 and a gate of an NMOS transistor 38 are connected to a drain of the NMOS transistor 36. A drain of an NMOS transistor 37 is connected to sources of the NMOS transistors 35 and 36. A source of the NMOS transistor 38 and a drain of an NMOS transistor 39 are connected to an output terminal 3. Sources of the PMOS transistors 33 and 34 and a drain of the NMOS transistor 38 are connected to a first power supply 21. Sources of the NMOS transistors 37 and 39 are connected to a second power supply 22. Gates of the NMOS transistors 37 and 39 are connected to a constant voltage source 32.

FIG. 5 shows an example of the structure of the comparator 4 that is composed of only bipolar transistors and resistors.

In FIG. 5, a base of an NPN transistor 42 is connected to an input terminal 31. A base of an NPN transistor 43 is connected to a reference input terminal 2. A first terminal of a resistor 40 is connected to a collector of the NPN transistor 42. A first terminal of a resistor 41 and a base of an NPN transistor 46 are connected to a collector of the NPN transistor 43. A collector of an NPN transistor 44 is connected to emitters of the NPN transistors 42 and 43. A first terminal of a resistor 45 is connected to an emitter of the NPN transistor 44. An emitter of the NPN transistor 46 and a collector of an NPN transistor 47 are connected to an output terminal 3. A first terminal of a resistor 48 is connected to an emitter of the NPN transistor 47. Second terminals of the resisters 40 and 41 and a collector of the NPN transistor 46 are connected to a first power supply 21. Second terminals of the resistors 45 and 48 are connected to a second power supply 22. Bases of the NPN transistors 44 and 47 are connected to a constant voltage source 32.

In each of the comparators shown in FIGS. 4 and 5, the input terminal 31 is referred to as the node A. The input terminal 2 is referred to as the node B. In these examples, a logic signal is supplied to the node A. A reference voltage that allows a constant voltage to be kept is supplied to the node B. The output terminal 3 outputs the result of which the constant voltage of the node B and the voltage of the logic signal of the node A have been compared. In reality, assuming that the voltage of the node A is larger than the reference voltage of the node B, the output terminal 3 outputs a signal in the high level that is closer to the first power supply voltage. Assuming that the voltage of the node A is smaller than the reference voltage of the node B, the output terminal 3 outputs a signal in the low level that is closer to the second power supply voltage.

Next, the operation of the comparator 4 with the structure shown in FIG. 4 will be described. When the voltage of the node A (input terminal 31) is larger than the reference voltage of the node B (input terminal 2), the NMOS transistor 35 is in the connected state and the NMOS transistor 36 is in the open state. Since the PMOS transistor 34 is in the connected state, the voltage of the first power supply 21 is supplied to the gate of the NMOS transistor 38. Thus, the NMOS transistor 38 is in the connected state. The output terminal 3 outputs a signal in the high level that is closer to the first power supply voltage. When the voltage of the node A (input terminal 31) is smaller than the reference voltage of the node B (input terminal 2), the NMOS transistor 35 is in the open state and the NMOS transistor 36 is in the connected state. Since the NMOS transistors 36 and 37 are in the connected state, a voltage that is closer to the second power supply 22 is supplied to the gate of the NMOS transistor 38. Thus, the NMOS transistor 38 is in the open state. The output terminal 3 outputs a signal in the low level that is closer to the second power supply voltage.

Next, the operation of the comparator 4 with the structure shown in FIG. 5 will be described. When the voltage of the node A (input terminal 31) is larger than the reference voltage of the node B (input terminal 2), the NPN transistor 42 is in the connected state and the NPN transistor 43 is in the open state. A voltage of the first power supply 21 is supplied to the base of the NPN transistor 46 through the resistor 41. Thus, the NPN transistor 46 is in the connected state. The output terminal 3 outputs a signal in the high level that is closer to the first power supply voltage. When the voltage of the node A (input terminal 31) is smaller than the reference voltage of the node B (input terminal 2), the NPN transistor 42 is in the open state and the NPN transistor 43 is in the connected state. Since the NPN transistors 43 and 44 are in the connected state, a voltage that is closer to the voltage of the second power supply 22 is supplied to the base of the NPN transistor 46. Thus, the NPN transistor 46 is in the open state. The output terminal 3 output a signal in the low level that is closer to the voltage of the second power supply.

The conventional variable delaying circuit shown in FIG. 3 can control a delay time corresponding to the operation of the above-described comparators.

In FIG. 3, assuming that a logic signal whose signal level varies from the low level to the high level is supplied to the input terminal 1, that the amplitude of the logic signal is denoted by E, that the resistance of the resistor 5 is denoted by R, that the capacitance of the capacitor 6 is denoted by C, and that the varying time of the logic signal is denoted by t, the voltage $V_A$ of the node A is expressed by the following formula.

$$V_A(t)=E-E\times\{exp(-t/C\times R)\} \quad (1)$$

Formula (1) represents that the voltage of the node A depends on an exponential variation of the resistance R of the resistor 5 and the capacitance C of the capacitor 6 as a time elapses.

For easy understanding of the voltage of the node A, FIG. 6 shows a waveform in a simulation.

With reference to FIG. 6, the operation of the related art reference will be described. Assuming that a signal shown in FIG. 6 is input to the node A (input terminal 31) and that a constant voltage the is the same as the voltage of the signal shown in FIG. 6 (this voltage is denoted by $V_0$), the comparator 4 determines whether the signal level of the signal is the high level or the low level of the signal at time ($t_0$) shown in FIG. 6. In other words, when the varying time t is in the range from 0 to $t_0$, the comparator 4 determines the level of the signal as the low level. In contrast, when the varying time t exceeds $t_0$, the comparator 4 determines the level of the signal as the low level. In this condition, to obtain a delay varying time, assuming that the reference voltage of the node B (reference input terminal 2) is varied from a constant voltage that is the same as the voltage ($V_0$) of the signal shown in FIG. 6 to a constant voltage that is the same as ($V_1$), the comparator 4 determines whether the signal level of the signal is the high level or the low level at time $t_1$ shown in FIG. 6. In other words, in FIG. 6, when the varying time is in the range from 0 to $t_1$, the comparator 4 determines the signal level of the signal as the low level. When the varying time exceeds $t_1$, the comparator 4 determines the level of the signal as the high level.

In other words, for example, in the case that the signal level varies from the low level to the high level, when a constant voltage of the node B (reference input terminal 2) varies from $V_0$ to $V_1$, the conventional variable delaying circuits obtain a delay varying time from $t_0$ to $t_1$.

However, in the above-described conventional variable delaying circuits, an exponential time variation of a logic signal that depends on a resistor and a capacitor is supplied to one input terminal of a comparator. By varying the reference voltage of the other input terminal and a determination point of the low level and the high level that the comparator determines, a delay variable time is obtained. However, in the conventional circuits, the delay varying time is not constant to the varying amount of the reference voltage. With reference to FIG. 6, this problem will be described in the following.

In FIG. 6, as was described above, elements that relate to the delay varying time are varying amounts ($V_0$, $V_1$, and $V_2$) of the reference voltage supplied to the comparator. In other words, in the case that the signal level of the signal varies from the low level to the high level, when the constant voltage of the node B (reference input terminal 2) shown in FIG. 3 varies from $V_0$ to $V_1$, the conventional variable delaying circuits can obtain a delay varying time from $t_0$ to $t_1$. In FIG. 6, the varying amount of the delay time to the varying amount of the reference voltage is around 20 nsec/V. When the constant voltage of the node B (reference input terminal 2) varies from $V_1$ to $V_2$, the delay varying time varies from $t_1$ to $t_2$. In FIG. 6, the varying amount of the delay time to the varying amount of the reference voltage is around 43 nsec/V. As is clear from Formula (1), the reason why the delay varying time largely depends on the constant voltage supplied to the node B is in that the variation of the logic signal of the node A (input terminal 1) shown in FIG. 3 is always exponentially proportional to the time variation. This is because the current that flows in the capacitor 6 shown in FIG. 3 is not constant. In other words, in the conventional variable delaying circuits, the delay varying amount to the varying amount of the reference input voltage is too large. Thus, a desired delay varying time cannot be precisely controlled with the reference input voltage. Thus, a correct delay controlling amount cannot be obtained. In addition, as is clear from Formula (1), since the varying amounts of the resistance R and the capacitance C are exponentially proportional to the time variation. Thus, the delay controlling amount is largely affected by the process dependency of the resistance R and the capacitance C.

SUMMARY OF THE INVENTION

Therefore, an object of the present invention is to provide a delaying circuit having a circuit means for converting a logical variation of an input signal level into a nearly linear level variation.

The present invention is a delaying circuit, comprising a first power supply line, a second power supply line, an input terminal, an output terminal, a resistor, a first capacitor connected between a first terminal of the resistor and the output terminal, a second capacitor connected between the second power supply line and a second terminal of the resistor, a first transistor having a main current path and a control electrode, the main current path being connected between the first power supply line and the output terminal, the control electrode being connected to the second terminal of the resistor, a first switch connected between the first power supply line and the first terminal of the resister, the first switch being turned on when the signal level of the input terminal is a first logic level, the first switch being turned off when the signal level of the input terminal is a second logic level, a second switch connected in parallel with the second capacitor, the second switch being turned on when the signal level of the input terminal is the first logic level, the second switch being turned off when the signal level of the input terminal is the second logic level, and a circuit means, connected between the output terminal and the second power supply line, for forming an electric path between the output terminal and the second power supply line when the signal level of the input terminal is the first logic level and for disconnecting the output terminal from the second power supply line when the signal level of the input terminal is the second logic level.

Thus, when an input signal varies from a first logic level to a second logic level, a nearly linear level variation is obtained at an output terminal. When the level variation is compared with a reference voltage by a comparator, the compared output has a nearly linear delay characteristic to the variation of the reference voltage.

These and other objects, features and advantages of the present invention will become more apparent in light of the following detailed description of best mode embodiments thereof, as illustrated in the accompanying drawings.

BRIEF DESCRIPTION OF DRAWINGS

FIG. 4 is a circuit diagram showing an example of the structure of a comparator according to the present invention and a related art reference, the comparator being composed of only MOS transistors;

FIG. 5 is a circuit diagram showing an example of the structure of a comparator according to the present invention and a related art reference, the comparator being composed of bipolar transistors;

FIG. 6 is a graph showing a waveform of a signal of node A of a conventional circuit; and FIG. 7 is a graph showing a waveform of a signal of node A of a circuit according to the first embodiment of the present invention.

DESCRIPTION OF PREFERRED EMBODIMENTS

Figure 1:
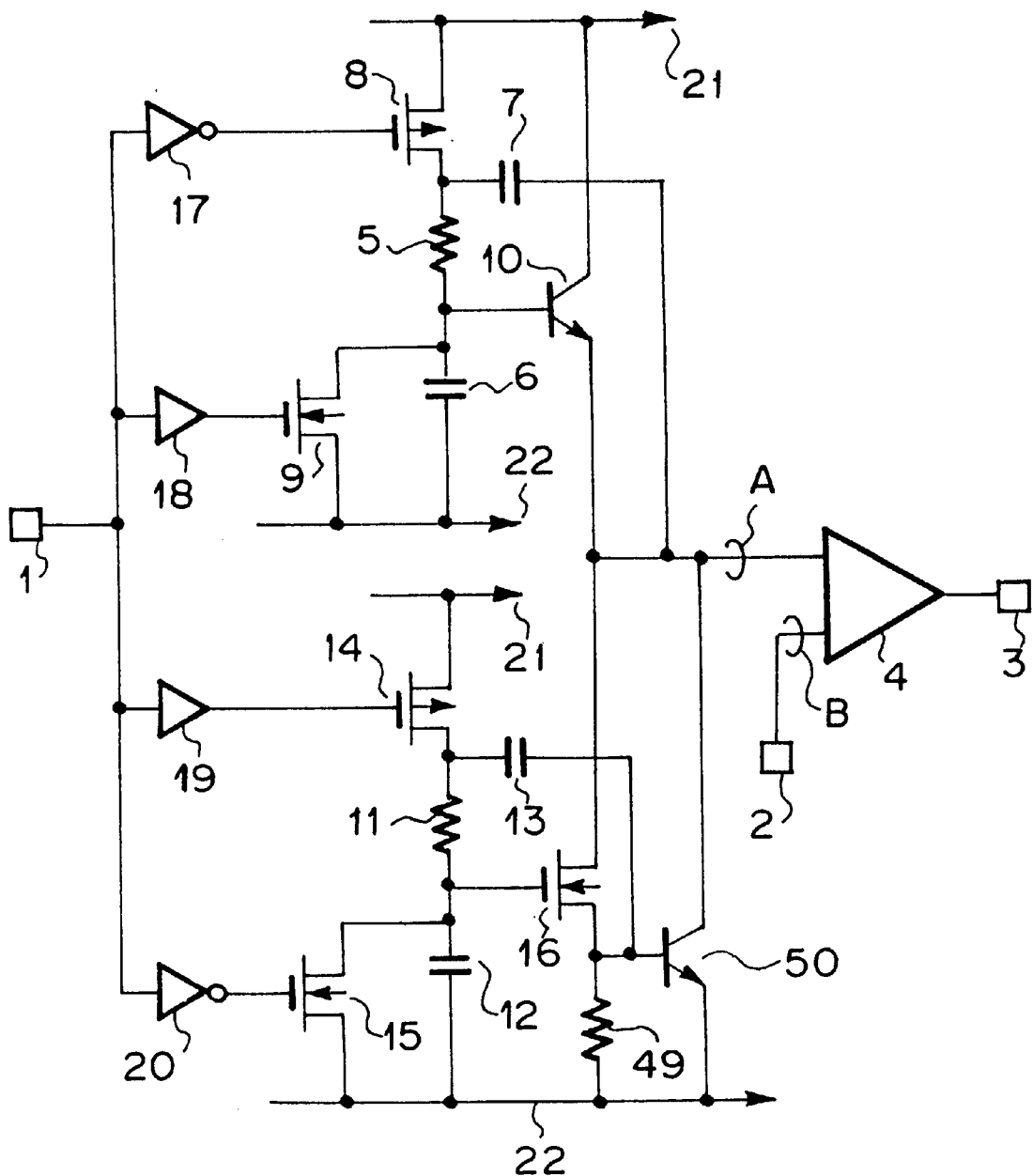
FIG. 1 is a circuit diagram showing the structure of a variable delaying circuit according to a first embodiment of the present invention.

FIG. 1 shows the structure of a variable delaying circuit according to a first embodiment of the present invention. In FIG. 1, input terminals of inverters 17 and 20 and input terminals of buffers 18 and 19 are connected to an input terminal 1. A gate of a PMOS transistor 8 is connected to an output terminal of the inverter 17. A gate of an NMOS transistor 9 is connected to an output terminal of the buffer 18. A gate of a PMOS transistor 14 is connected to an output terminal of the buffer 19. A gate of an NMOS transistor 15 is connected to an output terminal of the inverter 20. A first terminal of a resistor 5 and a first terminal of a capacitor 7 are connected to a drain of the PMOS transistor 8. A drain of the NMOS transistor 9, a base of an NPN transistor 10, and a first terminal of a capacitor 6 are connected to a second terminal of the resistor 5. A first terminal of a resistor 11 and a first terminal of a capacitor 13 are connected to a drain of the PMOS transistor 14. A drain of the NMOS transistor 15, a first terminal of a capacitor 12, and a gate of an NMOS transistor 16 are connected to a second terminal of the resistor 11. A second terminal of the capacitor 13, a first terminal of a resistor 49, and a base of an NPN transistor 50 are connected to a source of the NMOS transistor 16. A second terminal of the capacitor 7, a drain of the NMOS transistor 16, a collector of the NPN transistor 50, and a first input terminal of the comparator 4 are connected to an emitter of the NPN transistor 10. Sources of the PMOS transistors 8 and 14 and a collector of an NPN transistor 10 are connected to a first power supply terminal 21. Sources of the NMOS transistors 9 and 15, a second terminal of the resistor 49, an emitter of the NPN transistor 50, and second terminals of the capacitors 6 and 12 are connected to a second power supply terminal 22. A second input terminal of the comparator 4 is connected to a reference input terminal 2. An output terminal of the comparator 4 is connected to an output terminal 3. The structure of the comparator of the first embodiment is the same as the structure shown in FIG. 4. Thus, for simplicity, the description of the structure of the comparator 4 is omitted. As with the related art references, the input terminal of the comparator 4 connected to the emitter of the NPN transistor 10, the drain of the NMOS transistor 16, and the collector of the NPN transistor 50 is referred to as node A. The input terminal of the comparator 4 connected to the reference input terminal 2 is referred to as node B.

Next, the operation of the embodiment will be described. When the signal level of the input terminal 1 varies from the low level to the high level, since the signal level of the inverter 17 varies from the high level to the low level, the PMOS transistor 8 is turned on. Thus, the capacitor 7 is charged from the first power supply through the PMOS transistor 8. In addition, since the signal level of the buffer 18 varies from the low level to the high level, the NMOS transistor 9 is turned on. Thus, the capacitor 6 is discharged through the NMOS transistor 9. In addition, the signal level of the base of the NPN transistor 10 varies from the high level to the low level. Thus, the NPN transistor 10 is turned off. The signal level of the node A shown in FIG. 1 varies from the high level to the low level. At this point, the voltage of both the terminals of the capacitor 7 is the same as the voltage of the first power supply terminal 21. The transition from the off state to the on state of the NMOS transistor 16 also contributes to the variation of the signal level of the node A. This will be described later.

In the case that the signal level of the input terminal 1 varies from the high level to the low level, since the signal level of the inverter 17 varies from the low level to the high level, the PMOS transistor 8 is turned off. In addition, since the signal level of the buffer 18 varies from the high level to the low level, the NMOS transistor 9 is turned off. At this point, since the PMOS transistor 8 is turned off, the resistor 5 and the capacitors 6 and 7 are shut off from the first power supply. However, since the capacitor 7 has been charged and the capacitor 6 has been discharged, the capacitor 7 is discharged to the capacitor 6 through the resistor 5. In this case, the voltage of the emitter of the NPN transistor 10 (namely, the voltage $V_E$ of the node A) is expressed by the following differential equation.

$$\{dV_E(t)/dt\}+(1/C_6)\times\{(1/Z_{10})+(1-A_{10})/R_5\}\times V_E(t)=(A_{10}\times V_{CC})/(C_6\times R_5) \quad (2)$$

where VCC=first power supply voltage; $C_6$=capacitance of capacitor 6; $Z_{10}$=input impedance of NPN transistor 10; $A_{10}$ =voltage amplification factor; $R_5$=resistance of resistor 5; t=varying time The voltage $V_E$ in the case that the signal level of the input terminal 1 varies from the high level to the low level is initially zero. Thus, with $V_E(0)=0$, when the differential equation of Formula (2) is solved, $V_E(t)$ is expressed by the following formula.

$$V_E(t)=\{A_{10}\times V_{CC}/(1-A_{10}+R_5/Z_{10})\}\times[1-exp\{-t/(C_6\times Z_A)\}] \quad (3)$$

where $$Z_A=Z_{10}\times\{R_5/(1-A_{10})\}/\{Z_{10}+R_5/(1-A_{10})\}$$

Since the NPN transistor 10 is of collector grounded type, the voltage amplification factor ($A_{10}$) is 1 and the input impedance is very large. Thus, Formula (3) is approximately expressed by the following formula.

$$V_E(t) \approx \{V_{CC} \times t(C_6 \times R_5)\} \times \{1 - t/(2 \times C_6 \times Z_A)\} \quad (4)$$

$$\approx V_{CC} \times t/(C_6 \times R_5)$$

When Formula (4) is compared with Formula (1), it is clear that the former does not contain an exponential time variation, but is constant to a time variation. Thus, the node A connected to the emitter of the NPN transistor 10 is linearly proportional to a time variation t expressed by Formula (4).

FIG. 7 shows a time variation of the node A.

Figure 3:
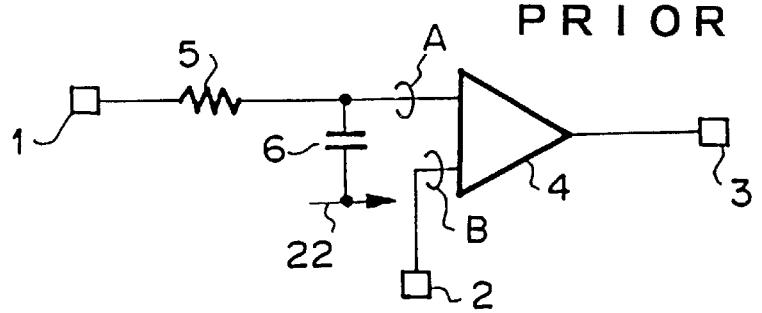
FIG. 3 is a circuit diagram showing a conventional variable delaying circuit.

FIG. 7 is a graph showing a waveform of a simulation of the node A according to the first embodiment of the present invention. In the related art reference shown in FIG. 6, in the case that the signal level varies from the low level to the high level, when the constant voltage of the node B (reference input terminal 2) shown in FIG. 3 varies from $V_0$ to $V_1$, the delay varying amount is around 20 nsec/V. When the constant voltage of the node B varies from $V_1$ to $V_2$, the delay varying amount is around 43 nsec/V. Thus, when they are compared, their difference is around 2.15 times. On the other hand, according to the first embodiment as shown in FIG. 7, when the constant voltage of the node B (reference input terminal 2) shown in FIG. 1 varies from $V_0$ to $V_1$, the delay varying amount ($t_1-t_0$) is around 19 nsec/V. When the constant voltage of the node B varies from $V_1$ to $V_2$, the obtained delay varying amount ($t_2-t_1$) is around 20 nsec/V. Thus, when they are compared, their difference is around 1.05 times. In other words, according to the first embodiment of the present invention, the linear time deviation can be obtained unlike with the exponential time deviation in the related art references. FIGS. 6 and 7 show the improvement of the present invention over the related art references.

In the case that the signal level of the input terminal 1 varies from the high level to the low level, when the signal level of the buffer 19 varies from the high level to the low level, the PMOS transistor 14 is turned on. Thus, the capacitor 13 is charged from the first power supply through the PMOS transistor 14. In addition, since the signal level of the inverter 20 varies from the low level to the high level, the NMOS transistor 15 is turned on. Thus, the capacitor 12 is discharged through the NMOS transistor 15. The voltage of the gate of the NMOS transistor 16 varies from the high level to the low level. The NMOS transistor 16 is turned off. At this point, since the resistor 49 causes the voltage of the base of the NPN transistor 50 to be the same as the voltage of the power supply terminal 22. Thus, the NPN transistor 50 is turned off, thereby contributing to causing the signal level of the node A to vary from the low level to the high level.

In the case that the signal level of the input terminal 1 varies from the low level to the high level, since the signal level of the buffer 19 varies from the low level to the high level, the PMOS transistor 14 is turned off. In addition, since the signal level of the inverter 20 varies from the high level to the low level, the NMOS transistor 15 is turned off. At this point, since the PMOS transistor 14 is turned off, the resistor 11 and the capacitors 12 and 13 are shut off from the first power supply. However, since the capacitor 13 has been charged and the capacitor 12 has been discharged, the capacitor 13 is discharged to the capacitor 12 through the resistor 11. In this case, the source voltage of the NMOS transistor 16 (namely, the base voltage $V_B$ of the NPN transistor 50) is expressed by the following differential equation.

$$\{dV_B(t)/dt\}+(1/C_{12})\times\{(1/Z_{16})+(1-A_{16})/R_{11}\}\times V_B(t)=(A_{16}\times V_{CC})/(C_{12}\times R_{11}) \quad (5)$$

where $V_{CC}$=voltage of first power supply; $C_{12}$=capacitance of capacitor 12; $Z_{16}$=input impedance of NMOS transistor 16; $A_{16}$=voltage amplification factor of NMOS transistor 16; $R_{11}$=resistance of resistor 11; t=varying time Formula (5) can be developed in the same manner as Formula (2). In other words, the voltage $V_B$ in the case that the signal level of the input terminal 1 varies from the low level to the high level is initially zero. Thus, with $V_B(0)=0$, when the differential equation of Formula 5 is solved, $V_B(t)$ can be expressed by the following equation.

$$V_B(t)=\{A_{16}\times V_{CC}/(1-A_{16}+R_{11}/Z_{16})\}\times[1-exp\{-t/(C_{12}\times Z_B)\}] \quad (6)$$

where $$Z_B=Z_{16}\times\{R_{11}/(1-A_{16})\}/\{Z_{16}+R_{11}/(1-A_{16})\}$$

Since the NMOS transistor 16 is of drain grounded type, the voltage amplification factor ($A_{16}$) is 1 and the input impedance is very large. Thus, Formula (6) is approximately expressed as follows.

$$V_B(t) \approx \{V_{CC} \times t(C_{12} \times R_{11})\} \times \{1 - t/(2 \times C_{12} \times Z_B)\} \quad (7)$$

$$\approx V_{CC} \times t/(C_{12} \times R_{11})$$

When Formula (7) is compared with Formula (1), it is clear that the former does not contain an exponential time variation, but is constant to a time variation as with the description of Formula (4). Thus, the voltage of the base of the NPN transistor 50 is linearly proportional to a time variation t as expressed by Formula (7). Although the variation of the voltage of the base of the NPN transistor 50 is not linearly proportional to the variation of the current of the collector, the signal level of the node A does not linearly vary from the high level to the low level. However, by adjusting the size of the emitter of the NPN transistor 50 and the resistance of a resistor disposed between the emitter of the NPN transistor 50 and the second power supply terminal 22, a desired linearity of the variation of the signal level of the node A can be obtained.

As was described in the section of the related art references, the comparator 4 used in the variable delaying circuit can be roughly categorized as a structure of which the comparator 4 is composed of MOS transistors and a structure of which the comparator 4 is composed of bipolar transistors. Generally, although MOS transistors can be highly integrated as an advantage, their electric characteristics largely fluctuate due to fluctuation of fabrication as a disadvantage. On the other hand, although bipolar transistors operate at high speed and the fluctuation of their electric characteristics due to fluctuation of fabrication is small as advantages, it is difficult to highly integrate them as a disadvantage. The MOS transistors and the bipolar transistors are used corresponding to the specifications of the integrated circuits. Thus, corresponding to the characteristics of the transistors of the integrated circuits for use, the variable delaying circuit should be applied to both the MOS transistors and the bipolar transistors.

In the first embodiment of the present invention, the comparator 4 is of MOS transistor type as shown in FIG. 4. This is because there is no DC current path to the comparator. In FIG. 4, the input terminal 31 as the node A is connected to the gate of the NMOS transistor 35. However, since there is no DC path from the gate of the MOS transistor to the drain or the source thereof, there is no DC current component that is input and output from/to the node A.

However, as described above, in the integrated circuits that use the advantages of the bipolar transistors, the comparator 4 is generally composed of the circuit shown in FIG. 5. A bipolar transistor requires a current path from the base to the emitter. When a current supply to the bipolar transistor is stopped, the bipolar transistor is turned off. Thus, to keep the bipolar transistor to be in the on state, a means for constantly supplying a current is required. Next, as a second embodiment of the present invention, an example of a variable delaying circuit having such a current supplying means will be described.

Figure 2:
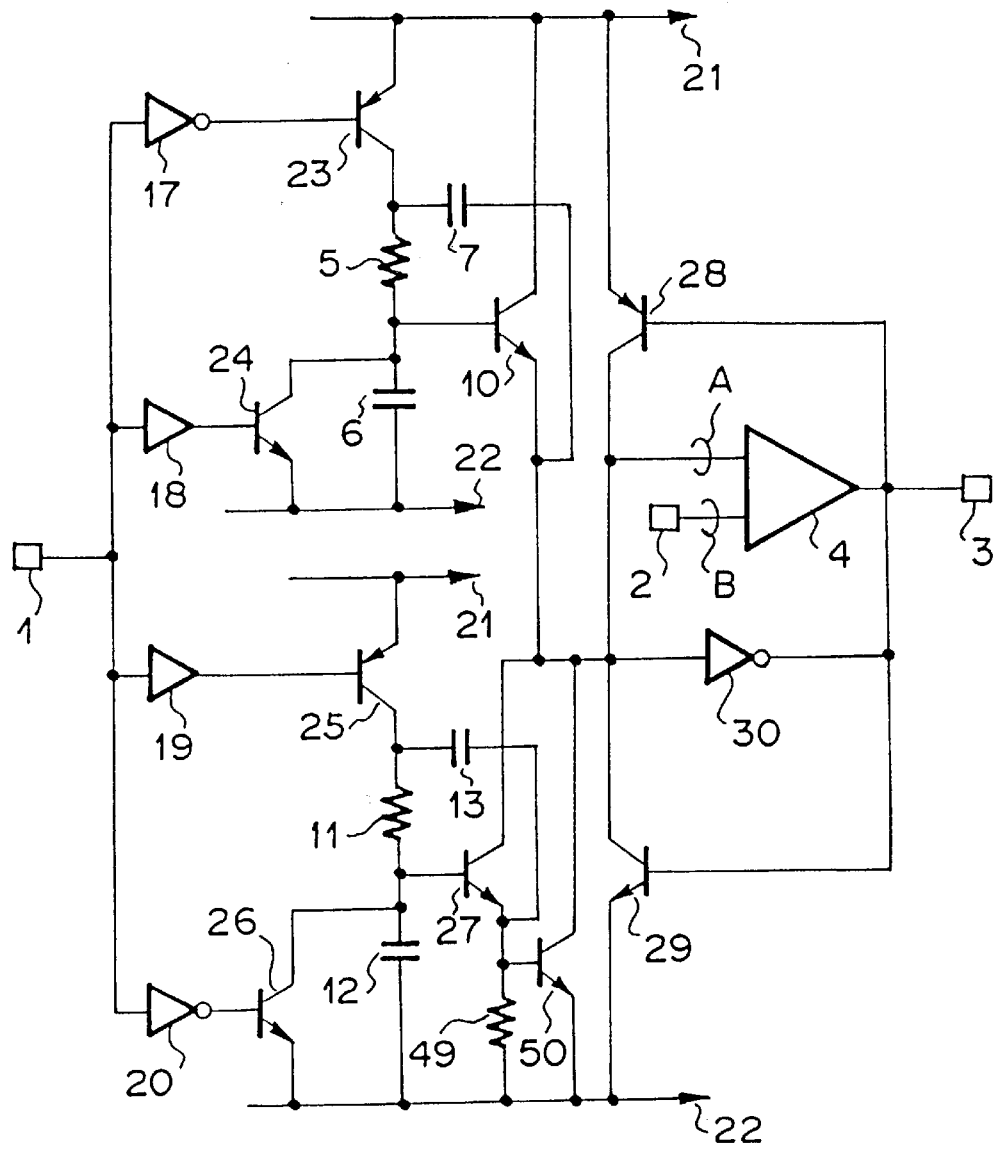
FIG. 2 is a circuit diagram showing the structure of a variable delaying circuit according to a second embodiment of the present invention.

FIG. 2 is a circuit diagram showing the structure of a variable delaying circuit according to a second embodiment of the present invention.

In the variable delaying circuit according to the second embodiment of the present invention, input terminals of invertors 17 and 20 and input terminals of buffers 18 and 19 are connected to an input terminal 1. A base of a PNP transistor 23 is connected to an output terminal of the inverter 17. A base of an NPN transistor 24 is connected to an output terminal of the buffer 18. A base of a PNP transistor 25 is connected to an output terminal of the buffer 19. A base of an NPN transistor 26 is connected to an output terminal of the inverter 20. A first terminal of a resistor 5 and a first terminal of a capacitor 7 are connected to a collector of the PNP transistor 23. A collector of the NPN transistor 24, a base of an NPN transistor 10, and a first terminal of a capacitor 6 are connected to a second terminal of the resistor 5. A first terminal of a resister 11 and a first terminal of a capacitor 13 are connected to a collector of the PNP transistor 25. A collector of the NPN transistor 26, a first terminal of the capacitor 12, and a base of an NPN transistor 27 are connected to a second terminal of the resister 11. A second terminal of the capacitor 13, a first terminal of a resistor 49, and a base of an NPN transistor 50 are connected to an emitter of the NPN transistor 27. A second terminal of the capacitor 7, collectors of the NPN transistors 27 and 50, a collector of a PNP transistor 28, a collector of an NPN transistor 29, an input terminal of an inverter 30, and a first input terminal of a comparator 4 are connected to an emitter of the NPN transistor 10. A base of the PNP transistor 28 and a base of the NPN transistor 29 are connected to the inverter 30. Emitters of the PNP transistors 23, 25, and 28 and a collector of an NPN transistor 10 are connected to a first power supply terminal 21. Emitters of the NPN transistors 24, 26, 27, 50, and 29, a second terminal of a resistor 49, and second terminals of capacitors 6 and 12 are connected to a second power supply terminal 22. A second input terminal of the comparator 4 is connected to a reference input terminal 2. An output terminal of the comparator 4 is connected to an output terminal 3. The structure of the comparator 4 is the same as the structure shown in FIG. 5. For simplicity, the description of the structure of the comparator 4 is omitted. As with the first embodiment, the input terminal of the comparator 4 connected to the emitter of the NPN transistor 10, the second terminal of the capacitor 7, the collector of the PNP transistor 28, the collectors of the NPN transistors 27, 50, and 29, and the input terminal of the inverter 30 is referred to as the node A. The input terminal of the comparator 4 connected to the reference input terminal 2 is referred to as the node B.

Next, with reference to FIG. 2, the operation of the variable delaying circuit according to the second embodiment of the present invention will be described. In FIG. 2, in the case that the signal level of the input terminal 1 varies from the low level to the high level, when the signal level of the inverter 17 varies from the high level to the low level, the PNP transistor 23 is turned on. Thus, the capacitor 7 is charged from the first power supply through the PNP transistor 23. In addition, since the signal level of the buffer 18 varies from the low level to the high level, the NPN transistor 24 is turned on. Thus, the capacitor 6 is discharged through the NPN transistor 24. The voltage of the base of the NPN transistor 10 varies from the high level to the low level. The NPN transistor 10 is turned off. The signal level of the node A shown in FIG. 2 varies from the high level to the low level. At this point, the voltage between both the terminals of the capacitor 7 is obtained by subtracting the voltage $V_{CE23}$ (around 0.4 V) between the collector and the emitter of the PNP transistor 23 and the voltage $V_{CE29}$ (around 0.3 V) between the collector and the emitter of the NPN transistor 29 from the voltage of the first power supply terminal 21. The transition from the off state to the on state of the NPN transistor contributes to the variation of the voltage of the node A. This will be described later.

Next, in the case that the signal level of the input terminal 1 varies from the high level to the low level, since the signal level of the inverter 17 varies from the low level to the high level, the PNP transistor 23 is turned off. In addition, since the signal level of the buffer 18 varies from the high level to the low level, the NPN transistor 24 is turned off. At this point, since the PNP transistor 23 is turned off, the resistor 5 and the capacitors 6 and 7 are shut off from the first power supply. However, since the capacitor 7 has been charged and the capacitor 6 has been discharged, the capacitor 7 is discharged to the capacitor 6 through the resistor 5. At this point, the voltage of the emitter of the NPN transistor 10 (namely, the terminal voltage $V_{E2}$ of the node A is expressed by the following differential equation.

$$\{dV_{E2}(t)/dt\}+(1/C_6)\times\{(1/Z_{10})+(1-A_{10})/R_5\}\times V_{E2}(t)= \{A_{10}\times(V_{CC}-V_{CE23}-V_{CE29})\}/(C_6\times R_5) \quad (8)$$

where $V_{CC}$=voltage of first power supply; $C_6$=capacitance of capacitor 6; $Z_{10}$=input impedance of NPN transistor 10; $A_{10}$=voltage amplification factor of NPN transistor 10; $R_5$=resistance of resistor 5; t=varying time In the above-described state (namely, in the case that the signal level of the input terminal 1 varies from the high level to the low level, the voltage $V_{E2}$ is initially zero. Thus, with $V_{E2}(0)=0$, when the differential equation of Formula (8) is solved, $V_{E2}(t)$ is expressed by the following formula.

$$V_{E2}(t)=\{A_{10}\times(V_{CC}-V_{CE23}-V_{CE29})\}/\{(1-A_{10}+(R_5/Z_{10})\}\times [1-exp\{-t/(C_6\times Z_A)\}] \quad (9)$$

where $$Z_A=Z_{10}\times\{R_5/(1-A_{10})\}/\{Z_{10}+R_5/(1-A_{10})\}$$

Since the NPN transistor 10 is of collector grounded type, the voltage amplification factor $(A_{10})$ is 1 and the input impedance is very large. Thus, Formula (9) is approximately expressed by the following formula.

$$\begin{aligned}V_{E2}(t) &\approx \{(V_{CC}-V_{CE23}-V_{CE29})\times t/\\ &\quad (C_6\times R_5)\}\times\{1-t/(2\times C_6\times Z_A)\}\\ &\approx (V_{CC}-V_{CE23}-V_{CE29})\times t/(C_6\times R_5)\end{aligned} \quad (10)$$

When Formula (10) is compared with Formula (1), it is clear that the former does not contain an exponential time variation, but is constant to a time variation. Thus, the variation of the signal level of the node A connected to the emitter of the NPN transistor 10 is linearly proportional to the time variation t expressed by Formula (10).

After a propagation delay time of the inverter 30 has elapsed, since a signal in the low level is supplied from the inverter 30 to the base of the PNP transistor 28, a current path from the first power supply to the node A is formed. Thus, the current flows to the comparator 4 connected to the node A. A DC current that causes the signal level to be kept in the high level is supplied from the PNP transistor 2. In other words, the time variation of the signal of the node A is linearized as expressed by Formula (10). In addition, a current is supplied to the comparator 4.

On the other hand, in the case that the signal level of the input terminal 1 varies from the high level to the low level, since the signal level of the buffer 19 varies from the high level to the low level, the PNP transistor 25 is turned on. Thus, the capacitor 13 is charged from the first power supply through the PNP transistor 25. In addition, since the signal level of the inverter 20 varies from the low level to the high level, the NPN transistor 26 is turned on. Thus, the capacitor 12 is discharged through the NPN transistor 26. The voltage of the base of the NPN transistor 27 varies from the high level to the low level. The NPN transistor 27 is turned off. At this point, since the resistor 49 causes the voltage of the base of the NPN transistor 50 to be the same as the voltage of the power supply terminal 22, the NPN transistor 50 is turned off, thereby contributing to causing the signal level of the node A to vary from the low level to the high level. In the case that the signal level of the input terminal 1 varies from the low level to the high level, since the signal level of the buffer 19 varies from the low level to the high level, the PNP transistor 25 is turned off. In addition, since the signal level of the inverter 20 varies from the high level to the low level, the NPN transistor 26 is turned on. At this point, since the PNP transistor 25 is turned off, the resistor 11 and the capacitors 12 and 13 are shut off from the first power supply. However, since the capacitor 13 has been charged and the capacitor 12 has been discharged, the capacitor 13 is discharged to the capacitor 12 through the resistor 11. In this case, the voltage of the emitter of the NPN transistor 27 (namely, the voltage $V_{B2}$ of the base of the NPN transistor 50) is expressed by the following differential equation.

$$\{dV_{B2}(t)/dt\}+(1/C_{12})\times\{(1/Z_{27})+(1-A_{27})/R_{11}\}\times V_{B2}(t)= \{A_{27}\times(V_{CC}-V_{CE25})/(C_{12}\times R_{11})\} \quad (11)$$

where $V_{CC}$=voltage of first power supply; $C_{12}$=capacitance of capacitor 12; $Z_{27}$=input impedance of NPN transistor 27; $A_{27}$=voltage amplification factor of NPN transistor 27; $R_{11}$=resistance of resistor 11; t=varying time; $V_{CE25}$=voltage between emitter and collector of NPN transistor 25

Formula (11) can be developed in the same manner as Formula (8). In other words, when the signal level of the input terminal 1 varies from the low level to the high level, the voltage $V_{B2}$ is initially zero. Thus, with $V_{B2}(0)=0$, when the differential equation of Formula (11) is solved, $V_{B2}(t)$ is expressed by the following formula.

$$V_{B2}(t)=\{A_{27}\times(V_{CC}-V_{CE25})/(1-A_{27}+R_{11}/Z_{27})\}\times [1-exp\{-t/(C_{12}\times Z_{B2})\}] \quad (12)$$

where $$Z_{B2}=Z_{27}\times\{R_{11}/(1-A_{27})\}/\{Z_{27}+R_{11}/(1-A_{27})\}$$

Since the NPN transistor 27 is of collector grounded type, the voltage amplification factor ($A_{27}$) is 1 and the input impedance is very large. Thus, Formula (12) is approximately expressed by the following formula.

$$V_{B2}(t) \approx \{(V_{CC}-V_{CE25})\times t/(C_{12}\times R_{11})\}\times \{1-t/(2\times C_{12}\times Z_{B2})\} \quad (13)$$
$$\approx (V_{CC}-V_{CE25})\times t/(C_{12}\times R_{11})$$

When Formula (13) is compared with Formula (1), it is clear that the former does not contain an exponential time variation, but is constant to a time variation as with the description of Formula (10). Thus, the variation of the voltage of the base of the NPN transistor 50 is linearly proportional to the time variation t expressed by Formula (13). Since the variation of the current of the collector is not linearly proportional to the variation of the voltage of the base of the NPN transistor 50, the variation of the signal level of the node A from the high level to the low level is not perfectly linear. However, as with the first embodiment, by adjusting the size of the emitter of the NPN transistor 50 and the resistance of a resistor disposed between the emitter of the NPN transistor 50 and the second power supply terminal 22, a desired linearity of the variation of the signal level of the node A can be obtained.

After a propagation delay time of the inverter 30 has elapsed, since a signal in the high level is supplied from the inverter 30 to the base of the NPN transistor 29, a current path from the node A to the second power supply 22 is formed. Thus, a DC current that causes the signal level of the signal supplied from the input side of the comparator 4 connected to the node A to be kept in the low level is supplied from the NPN transistor 29. In other words, in addition to the linearity of the time variation of the signal of the node A as expressed by Formula (13), a current can be supplied from the comparator 4. When the comparator 4 is composed of NPN transistors as shown in FIG. 5, such a current is not present. In contrast, when the comparator 4 is composed of PNP transistors, such a current is present.

In the first and second embodiments, variable delaying circuits that cause the variation from the low level to the high level or from the high level to the low level of the voltage of the node A to be nearly linear were described. However, depending on a system or a circuit, an output signal with a predetermined delaying characteristic may be required against the variation from the low level to the high level of an input signal. In contrast, an output signal with a predetermined delay characteristic may be required against the variation from the high level to the low level of an input signal. In these cases, only the upper side circuit or only the lower side circuit shown in FIGS. 1 and 2 is used.

In these embodiments, the variable delaying circuits are composed of both the MOS transistors and bipolar transistors. However, the variable delaying circuits may be composed of only bipolar transistors or only MOS transistors. In other words, the variable delaying circuits may be composed with a transistor whose gate or base is used as a control electrode and of which the connection of the main current path between the drain and source or between the collector and emitter is controlled corresponding to the signal supplied to the control electrode.

As described above, according to the present invention, the delay controlling means that varies an input signal with the time constant of a particular resistor and a particular capacitor causes the exponential variation of the current that flows in the resistor and capacitor to be changed to the linear variation. Thus, the time variation of the signal that is input to the converter circuit is linearized. Consequently, the delay varying amount against the varying amount of any constant voltage can be linearized. Thus, in comparison with the exponential delay varying time, a linear delay varying time can be precisely obtained. In addition, unlike with the exponential variation as the variable delay time accuracy as the influence of the process dependency of the resistance R and the capacitance C, according to the present invention, the linear variation of the variable delaying time can be accomplished.

Even if there is a DC current path in the comparator, when the current supplying means is added to the delay controlling means, in addition to the above-described improved effects, a current can be supplied. Thus, a variable delaying circuit that can be disposed to an integrated circuit composed of MOS transistors or bipolar transistors can be accomplished.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. A delaying circuit, comprising:
   a first power supply line;
   a second power supply line;
   an input terminal;
   an output terminal;
   a resistor;
   a first capacitor connected between a first terminal of said resistor and said output terminal;
   a second capacitor connected between said second power supply line and a second terminal of said resistor;
   a first transistor having a main current path and a control electrode, the main current path being connected between said first power supply line and said output terminal, the control electrode being connected to the second terminal of said resistor;
   a first switch connected between said first power supply line and the first terminal of said resistor, said first switch being turned on when the signal level of said input terminal is a first logic level, said first switch being turned off when the signal level of said input terminal is a second logic level;
   a second switch connected in parallel with said second capacitor, said second switch being turned on when the signal level of said input terminal is the first logic level, said second switch being turned off when the signal level of the said input terminal is the second logic level; and
   circuit means, connected between said output terminal and said second power supply line, for forming an electric path between said output terminal and said second power supply line when the signal level of said input terminal is the first logic level and for disconnecting said output terminal from said second power supply line when the signal level of said input terminal is the second logic level.

2. A delaying circuit, comprising:
   a first power supply line;
   a second power supply line;
   an input terminal;
   an output terminal;
   a first resistor;
   a first terminal of a second resistor connected to said second power supply line;
   a first capacitor connected between a first terminal of said first resistor and a second terminal of said second resistor;
   a second capacitor connected between said second power supply line and a second terminal of said first resister;
   a first transistor having a main current path and a control electrode, the main current path being connected between said output terminal and the second terminal of said second resistor, the control electrode being connected to the second terminal of said first resistor;
   a second transistor having a main current path and a control electrode, the main current path being connected between said output terminal and said second power supply line, the control electrode being connected to the second terminal of said second resistor;
   a first switch connected between said first power supply line and the first terminal of said first resistor, said first switch being turned off when the signal level of said input terminal is a first logic level, said first switch being turned on when the signal level of said input terminal is a second logic level;
   a second switch connected in parallel with said second capacitor, said second switch being turned off when the signal level of said input terminal is the first logic level, said second switch being turned on when the signal level of said input terminal is the second logic level;
   circuit means, connected between said first power supply line and said output terminal, for disconnecting said output terminal from said first power supply line when the signal level of said input terminal is the first logic level and for forming an electric path between said output terminal and said first power supply line when the signal level of said input terminal is the second logic level.

3. A variable delaying circuit, comprising:
   a first power supply line;
   a second power supply line;
   an input terminal;
   an output terminal;
   a comparator circuit connected to said output terminal;
   a first resistor;
   a second resistor;
   a first terminal of a third resistor connected to said second power supply line;
   a first capacitor connected between a first terminal of said first resistor and said output terminal;
   a second capacitor connected between said second power supply line and a second terminal of said first resistor;
   a third capacitor connected between a first terminal of said second resistor and a second terminal of said third resistor;
   a fourth capacitor connected between said second power supply line and a second terminal of said second resistor;
   a first transistor having a main current path and a control electrode, the main current path being connected between said first power supply line and said output terminal, the control electrode being connected to the second terminal of said first resistor;
   a second transistor having a main current path and a control electrode, the main current path being connected between said output terminal and the second terminal of said third resistor, the control electrode being connected to the second terminal of said second resistor;
   a third transistor having a main current path and a control electrode, the main current path being connected between said output terminal and said second power supply line, the control electrode being connected to the second terminal of said third resistor;

a first switch connected between said first power supply line and the first terminal of said first resistor, said first switch being turned on when the signal level of said input terminal is a first logic level, said first switch being turned off when the signal level of said input terminal is a second logic level;

a second switch connected in parallel with said second capacitor, said second switch being turned on when the signal level of said input terminal is the first logic level, said second switch being turned off when the signal level of said input terminal is the second logic level;

a third switch connected between said first power supply line and the first terminal of said second resistor, said third switch being turned off when the signal level of said input terminal is the first logic level, said third switch being turned on when the signal level of said input terminal is the second logic level; and a fourth switch connected in parallel with said fourth capacitor, said fourth switch being turned off when the signal level of said input terminal is the first logic level, said fourth switch being turned on when the signal level of said input terminal is the second logic level.

4. The delaying circuit as set forth in claim 1, further comprising:

a second transistor connected in parallel with said first transistor, the conduction type of said second transistor being different from that of said first transistor; and an inverter circuit connected between said output terminal and a control electrode of said second transistor.

5. The delaying circuit as set forth in claim 1, further comprising a comparator for comparing a reference voltage with a voltage of said output terminal.

6. The delaying circuit as set forth in claim 1,
wherein said first switch is a PMOS transistor and said second switch is a NMOS transistor.

7. The delaying circuit as set forth in claim 5,
wherein a output signal of said comparator has a delay time from the first logic level.

8. The delaying circuit as set forth in claim 2, further comprising:

a third transistor connected in parallel with said second transistor; and an inverter circuit connected between said output terminal and a control electrode of said third transistor.

9. The delaying circuit as set forth in claim 2, further comprising a comparator for comparing a reference voltage with a voltage of said output terminal.

10. The delaying circuit as set forth in claim 2,
wherein said first switch is a PMOS transistor and said second switch is a NMOS transistor.

11. The delaying circuit as set forth in claim 9,
wherein a output signal of said comparator has a delay time from the first logic level.

12. The variable delaying circuit as set forth in claim 3, further comprising:

a fourth transistor connected in parallel with said first transistor, the conduction type of said fourth transistor being different from that of said first transistor;

a fifth transistor connected in parallel with said third transistor; and an inverter circuit connected between said output terminal and a control terminal of said fourth transistor.

13. The variable delaying circuit as set forth in claim 3,
wherein said first switch and said third switch are a PNP transistor respectively, and said second switch and said fourth switch are a NPN transistor respectively.

* * * * *